US011791826B2

(12) United States Patent
Lee et al.

(10) Patent No.: US 11,791,826 B2
(45) Date of Patent: Oct. 17, 2023

(54) CLOCK RECOVERY CIRCUIT FOR DISPLAY

(71) Applicant: LX Semicon Co., Ltd., Daejeon (KR)

(72) Inventors: Jong Suk Lee, Daejeon (KR); Won Kim, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 18/074,284

(22) Filed: Dec. 2, 2022

(65) Prior Publication Data

US 2023/0188144 A1    Jun. 15, 2023

(30) Foreign Application Priority Data

Dec. 9, 2021  (KR) .......................... 10-2021-0175590

(51) Int. Cl.
*H03L 7/08*    (2006.01)
*H03L 7/081*   (2006.01)
*H03L 7/093*   (2006.01)

(52) U.S. Cl.
CPC .......... *H03L 7/0807* (2013.01); *H03L 7/0812* (2013.01); *H03L 7/093* (2013.01)

(58) Field of Classification Search
CPC ...... H03L 7/0807; H03L 7/0812; H03L 7/093
See application file for complete search history.

(56) References Cited

U.S. PATENT DOCUMENTS

| | | | | |
|---|---|---|---|---|
| 8,773,182 B1* | 7/2014 | Degani | ................... | H03L 7/085 |
| | | | | 327/158 |
| 9,197,402 B2* | 11/2015 | Kim | ...................... | H04L 7/0331 |
| 9,362,924 B1* | 6/2016 | Xu | ........................ | H03L 7/0992 |
| 10,892,763 B1* | 1/2021 | Hidaka | ................... | H03L 7/087 |
| 2003/0109222 A1* | 6/2003 | Sun | ....................... | H03F 1/3294 |
| | | | | 455/24 |
| 2005/0162204 A1* | 7/2005 | Lee | .......................... | H03L 7/00 |
| | | | | 327/158 |
| 2008/0136698 A1* | 6/2008 | Choi | ..................... | G04F 10/005 |
| | | | | 341/155 |
| 2011/0001537 A1* | 1/2011 | Kim | ...................... | H03K 5/131 |
| | | | | 327/276 |
| 2015/0213779 A1* | 7/2015 | Baek | ..................... | G09G 5/008 |
| | | | | 345/204 |
| 2018/0006849 A1* | 1/2018 | Jang | ....................... | H04L 7/043 |
| 2021/0359688 A1* | 11/2021 | Pyun | ..................... | G09G 5/008 |
| 2021/0399722 A1* | 12/2021 | Hamdan | ................. | H03L 7/081 |

(Continued)

FOREIGN PATENT DOCUMENTS

| | | | | |
|---|---|---|---|---|
| EP | 2882131 A1 * | 6/2015 | ............... | H03L 7/07 |
| EP | 2884228 A2 * | 6/2015 | ......... | G01C 19/5614 |

(Continued)

*Primary Examiner* — Adam D Houston
(74) *Attorney, Agent, or Firm* — POLSINELLI PC

(57) ABSTRACT

The present disclosure discloses a clock recovery circuit for a display, which recovers a clock from a clock data signal. The clock recovery circuit includes a clock recoverer configured to generate delayed clocks using a multi-stage delay chain including delay units; and a delay compensator configured to control a first delay time of a first delay unit to be the same as a second delay time of remaining delay units. The clock recovery circuit may compensate for a difference in delay time between the first delay time and the second delay time.

17 Claims, 6 Drawing Sheets

(56) References Cited

U.S. PATENT DOCUMENTS

| | | | |
|---|---|---|---|
| 2022/0029779 A1* | 1/2022 | Lee | H03L 7/0807 |
| 2023/0188125 A1* | 6/2023 | Lee | H03K 5/14 |
| | | | 327/158 |
| 2023/0188144 A1* | 6/2023 | Lee | H03L 7/093 |
| | | | 327/157 |

FOREIGN PATENT DOCUMENTS

| | | | |
|---|---|---|---|
| JP | 2009-504058 A | | 1/2009 |
| KR | 10-0743493 A | | 7/2007 |
| KR | 101550529 B1 | * | 9/2015 |
| KR | 102045898 B1 | * | 11/2019 |

* cited by examiner

CLOCK RECOVERY CIRCUIT FOR DISPLAY

BACKGROUND

1. Technical Field

Various embodiments generally relate to a clock recovery circuit for a display, and more particularly, to a clock recovery circuit for a display, which recovers a clock from a clock-embedded clock data signal.

2. Related Art

A display may include a data transmission device, a data reception device and a display panel.

The data transmission device is configured to transmit data for display. The data transmission device may be understood as a general timing controller. For example, data may be transmitted in a clock-embedded format, and a signal transmitted in this way may be referred to as a clock data signal.

The data reception device may be configured to receive the clock data signal, recover the clock from the clock data signal, recover the data using the clock to be recovered, and generate and output a source signal for display using the recovered clock. The data reception device may be understood as a general source driver.

The display panel may display a desired image by receiving the source signal.

The data reception device needs to extract and recover the clock from the clock data signal without a separate oscillator, and to this end, may include a clock recovery circuit.

The clock recovery circuit may be designed to recover the clock without a separate oscillator, by being configured on the basis of a delay-locked loop. The delay-locked loop configured in the clock recovery circuit may include delay units which form a multi-stage delay chain.

In general, a time constant that is applied in transferring a clock between delay units of a delay chain may be uniformly formed. However, a time constant that is applied to an input side of a first delay unit which receives the clock extracted from the clock data signal may be formed differently from the time constant between the delay units.

This phenomenon may occur because the input/output capacitance formed between the delay units and the capacitance of the input side of the first delay unit are different from each other. The difference in capacitance may be caused by the influence of a process for manufacturing the data reception device.

The difference in capacitance causes a difference in delay time between the first delay unit and the remaining delay units, and the difference in delay time affects a margin for the setup or hold of data when the data is recovered using the recovered clock. In particular, in the case of a high-speed operation in which a time for recovering data is short, the difference in delay time may cause difficulty in recovering the data.

SUMMARY

Various embodiments are directed to a clock recovery circuit for a display, which eases the recovery of a clock in a high-speed operation.

In addition, various embodiments are directed to a clock recovery circuit for a display, which compensates for a difference in delay time occurring in a multi-stage delay chain configured in a clock recovery circuit of a data reception device, thereby easing the recovery of a clock and data and having scalability to changes in process.

In an embodiment, a clock recovery circuit for a display may include: a clock detector configured to detect a first clock in a clock data signal; a voltage control delay circuit including delay units which form a multi-stage delay chain, and configured to generate delayed clocks by delaying the first clock through the delay units; and a delay compensator configured to control capacitance of an input side of a first delay unit to compensate for a difference in delay time between a first delay time of the first delay unit and a second delay time of a second delay unit selected among remaining delay units.

In an embodiment, a clock recovery circuit for a display may include: a clock recoverer configured to generate delayed clocks by passing a first clock, detected in a clock data signal, through delay units which form a multi-stage delay chain; and a delay compensator configured to control a first delay time of a first delay unit to be the same as a second delay time of remaining delay units, wherein the delay compensator provides controlled capacitance to an input side of the first delay unit to compensate for a difference in delay time between the first delay time and the second delay time.

According to the embodiments of the present disclosure, it is possible to compensate for a difference in delay time occurring in a multi-stage delay chain configured in a clock recovery circuit of a data reception device.

Therefore, according to the embodiments of the present disclosure, advantages are provided in that a clock and data may be easily recovered and scalability to changes in process may be ensured.

Also, according to the embodiments of the present disclosure, a margin for the setup or hold of data, required when data is recovered using a recovered clock, may be stably secured, and as a result, advantages are provided in that data may be easily recovered in a high-speed operation.

DETAILED DESCRIPTION

An embodiment of a clock recovery circuit for a display in accordance with the present disclosure may be configured to control the capacitance of an input side of a first delay unit among delay units which form a multi-stage delay chain. In the embodiment of the present disclosure, by controlling the capacitance of the input side of the first delay unit, it is possible to compensate for a difference in delay time between the first delay unit and remaining delay units.

The embodiment of the clock recovery circuit for a display in accordance with the present disclosure will be described below with reference to FIG. 1.

Figure 1:
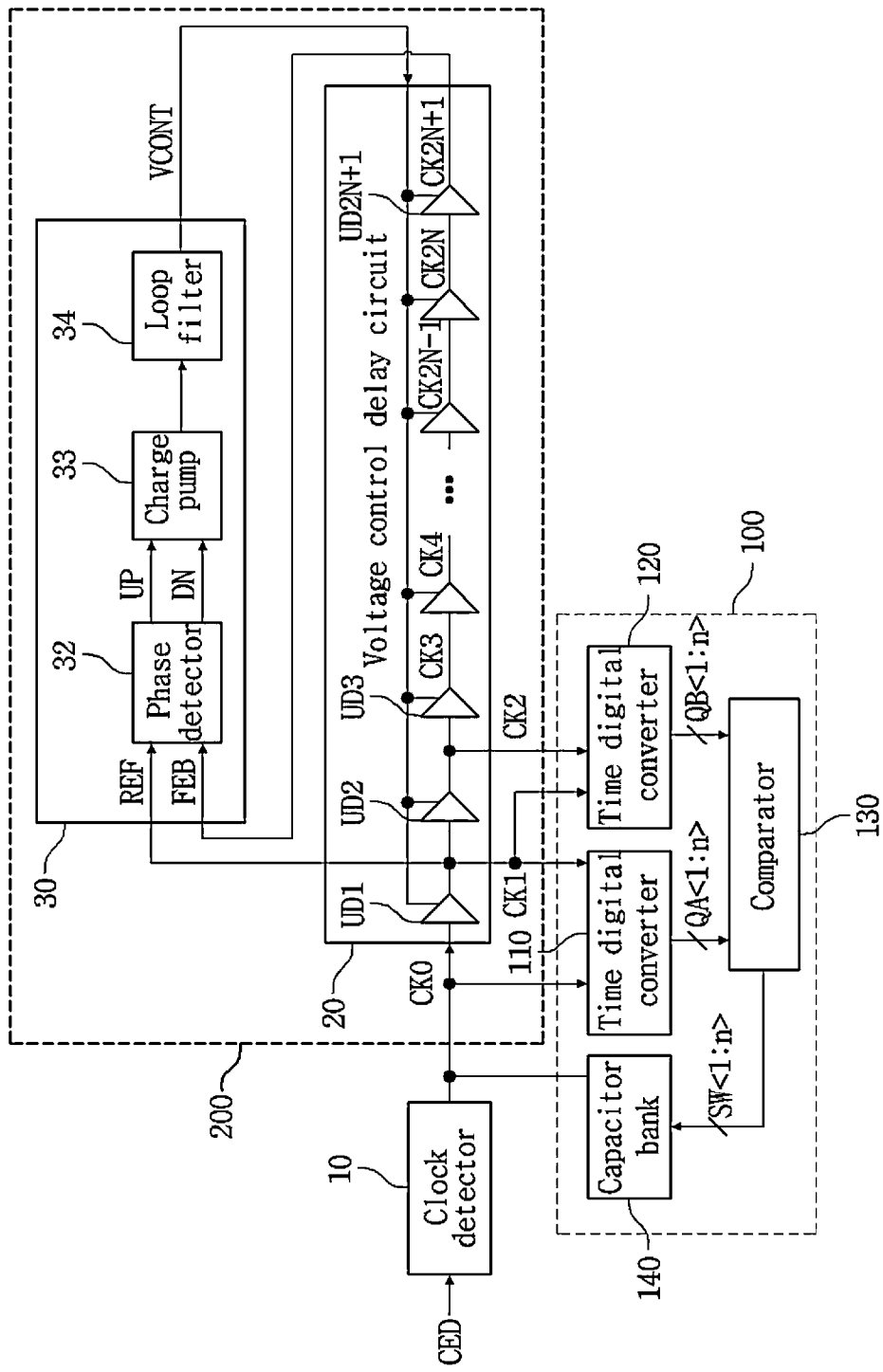
FIG. 1 is a block diagram illustrating an embodiment of a clock recovery circuit for a display in accordance with the present disclosure.

The clock recovery circuit of FIG. 1 may be implemented to include a clock detector 10, a delay compensator 100 and a clock recoverer 200.

The clock detector 10 may be configured to detect a clock embedded in data of a clock data signal CED and output the detected clock as a first clock CK0.

The clock data signal CED may be understood as a transmission signal packeted in a format in which a clock is embedded in data.

The first clock CK0 may be provided to an input side of a first delay unit UD1 among delay units forming a multi-stage delay chain configured in a voltage control delay circuit 20 of the clock recoverer 200 to be described later. Hereinafter, for the sake of convenience in explanation, the first clock CK0 will be referred to as a clock CK0.

Detecting the clock CK0 in the clock data signal CED may be implemented by various methods according to a fabricator's intention, and detailed description thereof will be omitted. For example, the clock CK0 may be detected by determining a transition time point of data included in the clock data signal CED.

The clock recoverer 200 may be configured to generate delayed clocks by passing the clock CK0, detected in the clock data signal CED, through the delay units forming the multi-stage delay chain.

The delay compensator 100 may be configured to control a first delay time of the first delay unit UD1 to be the same as a second delay time of a delay unit selected among remaining delay units.

A time constant that is applied in transferring a clock between delay units of a delay chain may be uniformly formed. That is to say, in the embodiment of the present disclosure, it is determined that the remaining delay units except the first delay unit UD1 have the same input/output capacitance. Therefore, it may be understood that the second delay time of the delay unit selected among the remaining delay units represents a delay time of each of the remaining delay units.

In the above configuration, the clock recoverer 200 may include the voltage control delay circuit 20 and a delay controller 30.

The voltage control delay circuit 20 includes delay units UD1 to UD2N+1 which form a multi-stage delay chain, and may be configured to generate clocks CK1 to CK2N+1 by delaying the clock CK0 through the delay units UD1 to UD2N+1. In more detail, the delay units UD1 to UD2N+1 may be connected in series and sequentially delay the clock CK0.

The delay controller 30 may be configured to output a voltage control signal VCONT corresponding to a phase difference between a reference clock REF and a feedback clock FEB. The reference clock REF may use a first delayed clock outputted from a first delay unit of a preset position among the delay units UD1 to UD2N+1. In the embodiment, the first delay unit may be set as a delay unit located at the first of delay units forming the multi-stage delay chain. That is, the delay unit UD1 may be set as the first delay unit. And, the first delayed clock is set as the clock CK1 which is outputted from the first delay unit UD1. The feedback clock FEB may use a second delayed clock which is outputted from the last delay unit UD2N+1, and the second delayed clock is set as the clock CK2N+1.

In more detail, the delay controller 30 may be exemplified to include a phase detector 32, a charge pump 33 and a loop filter 34.

The phase detector 32 may be configured to output an up control signal UP and a down control signal DN corresponding to the phase difference between the reference clock REF and the feedback clock FEB.

In more detail, the phase detector 32 may compare the phases of the reference clock REF and the feedback clock FEB, may provide, when the phase of the feedback clock FEB is earlier than that of the reference clock REF, the down control signal DN of a level corresponding to a phase difference to the loop filter 34, and may provide, when the phase of the feedback clock FEB is later than that of the reference clock REF, the up control signal UP of a level corresponding to a phase difference to the loop filter 34.

The charge pump 33 may be configured to provide, to the loop filter 34, an output voltage as charges are charged by performing a pull-up in response to the up control signal UP or charges are discharged by performing a pull-down in response to the down control signal DN.

To this end, the charge pump 33 may include a pull-up element (not shown) and a pull-down element (not shown). The pull-up element may operate to raise the level of the output voltage by performing a pull-up operation in response to the up control signal UP, and the pull-down element may operate to lower the level of the output voltage by performing a pull-down operation in response to the down control signal DN.

The loop filter 34 may be configured to output the voltage control signal VCONT of a level corresponding to the output voltage provided from the charge pump 33.

In other words, the level of the voltage control signal VCONT outputted from the loop filter 34 may be raised in response to the up control signal UP, and may be lowered in response to the down control signal DN.

The voltage control delay circuit 20 may be configured to control delay times of the delay units UD1 to UD2N+1 according to the level of the voltage control signal VCONT of the delay controller 30. Namely, the delay times of the delay units UD1 to UD2N+1 of the voltage control delay circuit 20 may decrease when the level of the voltage control signal VCONT rises and may increase when the level of the voltage control signal VCONT falls.

The delay compensator 100 may be configured to include a capacitor bank 140 which is coupled to the input side of the first delay unit UD1. The capacitor bank 140 may provide controlled capacitance in correspondence to a difference in delay time between the first delay time of the first delay unit UD1 and the second delay time of the delay unit selected among the remaining delay units UD2 to UD2N+1.

That is to say, the delay compensator 100 may decrease capacitance in correspondence to a difference in delay time by which the first delay time of the first delay unit UD1 is longer than the second delay time of the selected delay unit, and may increase capacitance in correspondence to a difference in delay time by which the first delay time of the first delay unit UD1 is shorter than the second delay time of the selected delay unit.

As a result, the delay compensator 100 may control the capacitance of the input side of the first delay unit UD1 to be the same as the input/output capacitance of the selected delay unit, and may compensate for the difference in delay time between the first delay time of the first delay unit UD1 and the second delay time of the selected delay unit.

To this end, the delay compensator 100 may be configured to include time digital converters 110 and 120, a comparator 130 and the capacitor bank 140.

The time digital converter 110 is to output a first delay value corresponding to the first delay time of the first delay unit UD1 by comparing a first clock and a second clock of the input side and an output side of the first delay unit UD1. To this end, the time digital converter 110 may be configured to output a first delay value QA<1:n> corresponding to the first delay time by comparing the input-side clock CK0 and the output-side clock CK1 of the first delay unit UD1. It may be understood that the first clock corresponds to the clock CK0 and the second clock corresponds to the clock CK1.

The time digital converter 120 is to output a second delay value corresponding to the second delay time by comparing a third clock and a fourth clock of an input side and an output side of the delay unit selected among the remaining delay units UD2 to UD2N+1. To this end, the time digital converter 120 may be configured to output a second delay value QB<1:n> corresponding to the second delay time by comparing the input-side clock CK1 and the output-side clock CK2 of the delay unit UD2 located at the second of delay units forming the multi-stage delay chain. It may be understood that the third clock corresponds to the clock CK1 and the fourth clock corresponds to the clock CK2.

In other words, in the embodiment of the present disclosure, it is described that the second clock of the time digital converter 110 and the third clock of the time digital converter 120 are the same. However, when the selected delay unit is changed, the second clock of the time digital converter 110 and the third clock of the time digital converter 120 may be different from each other.

The comparator 130 may be configured to compare the first delay value QA<1:n> of the time digital converter 110 and the second delay value QB<1:n> of the time digital converter 120 to output a comparison value SW<1:n> corresponding to a difference in delay time.

The capacitor bank 140 may be configured to provide capacitance, controlled in response to the comparison value SW<1:n>, to the input side of the first delay unit UD1.

Figure 2:
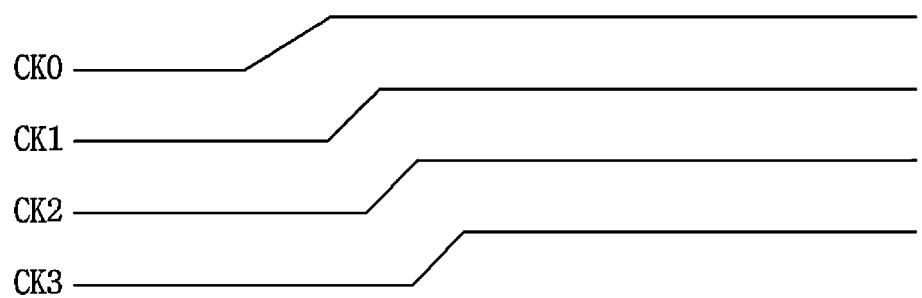
FIG. 2 is a waveform diagram illustrating a case where a delay time of a first delay unit is longer than that of remaining delay units.
Figure 3:
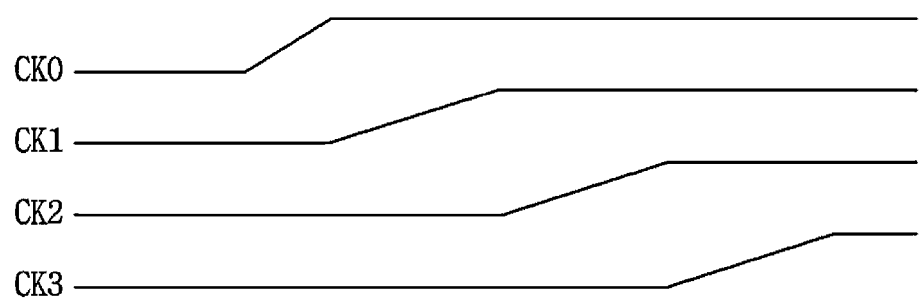
FIG. 3 is a waveform diagram illustrating a case where a delay time of the first delay unit is shorter than that of the remaining delay units.

When the capacitance of the input side of the first delay unit UD1 is different from the input/output capacitance formed between the remaining delay units UD2 to UD2N+1, the delay time of the first delay unit UD1 may be longer than that of the remaining delay units UD2 to UD2N+1 as shown in FIG. 2, or may be shorter than that of the remaining delay units UD2 to UD2N+1 as shown in FIG. 3.

FIG. 2 shows that the clock CK0 received by the first delay unit UD1 has a gentler slope than the clocks CK1, CK2 and CK3 received by other delay units UD2, UD3 and UD4. In this case, the first delay time of the first delay unit UD1 is longer than the second delay time of the other delay units UD2, UD3 and UD4.

FIG. 3 shows that the clock CK0 received by the first delay unit UD1 has a steeper slope than the clocks CK1, CK2 and CK3 received by other delay units UD2, UD3 and UD4. In this case, the first delay time of the first delay unit UD1 is shorter than the second delay time of the other delay units UD2, UD3 and UD4.

The embodiment of the present disclosure performs an operation for compensating for that as shown in FIGS. 2 and 3, the first delay time of the first delay unit UD1 has a difference from the second delay time of other delay units UD2, UD3 and UD4.

Figure 4:
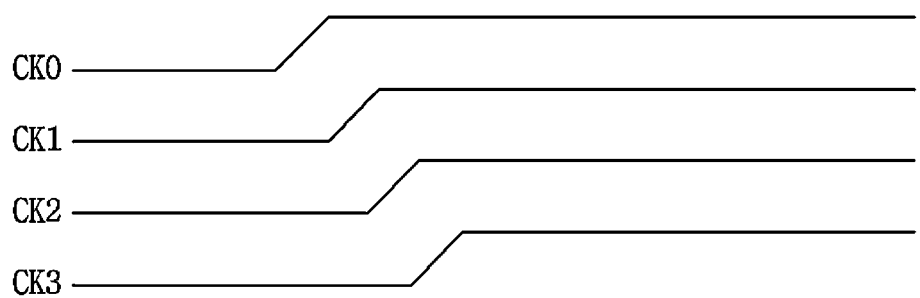
FIG. 4 is a waveform diagram illustrating a case where the delay time of the first delay unit is compensated by the embodiment in the case of FIG. 2.
Figure 5:
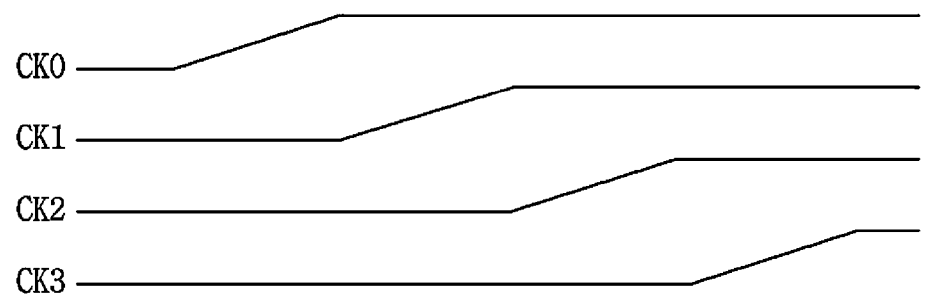
FIG. 5 is a waveform diagram illustrating a case where the delay time of the first delay unit is compensated by the embodiment in the case of FIG. 3.

As a result, as shown in FIGS. 4 and 5, the clock CK0 received by the first delay unit UD1 may be compensated to have the same slope as the clocks CK1, CK2 and CK3 received by the other delay units UD2, UD3 and UD4.

Further detailed description of the delay compensator 100 for this will be made below with reference to FIGS. 6 to 11.

The embodiment of the present disclosure is configured to compare the first delay time of the first delay unit UD1 and the second delay time of the delay unit UD2 among the delay units, forming the multi-stage delay chain, included in the voltage control delay circuit 20.

Figure 6:
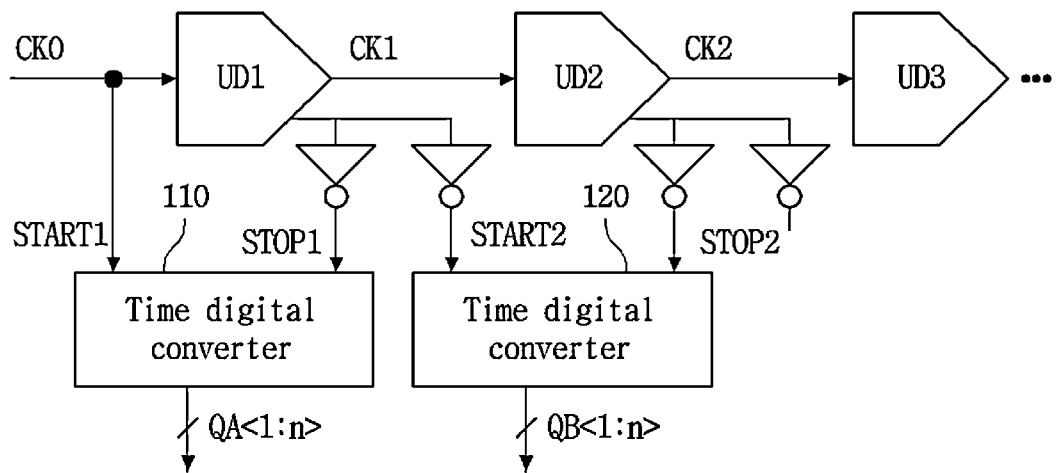
FIG. 6 is a detailed block diagram illustrating that clocks are transferred from a voltage control delay circuit to time digital converters.

Referring to FIG. 6, the time digital converter 110 is configured to receive the clock CK0 of the input side of the delay unit UD1 as a start clock START1 and receive the clock CK1 of the output side of the delay unit UD1 as a stop clock STOP1. The time digital converter 120 is configured to receive the clock CK1 of an input side of the delay unit UD2 as a start clock START2 and receive the clock CK2 of an output side of the delay unit UD2 as a stop clock STOP2. If necessary, the time digital converter 110 and the time digital converter 120 may be configured to receive the clock CK1 of the output side of the delay unit UD1, the clock CK1 of the input side of the delay unit UD2 and the clock CK2 of the output side of the delay unit UD2 through inverters. The use of the inverters may be selected according to logics designed inside the time digital converters 110 and 120.

Figure 7:
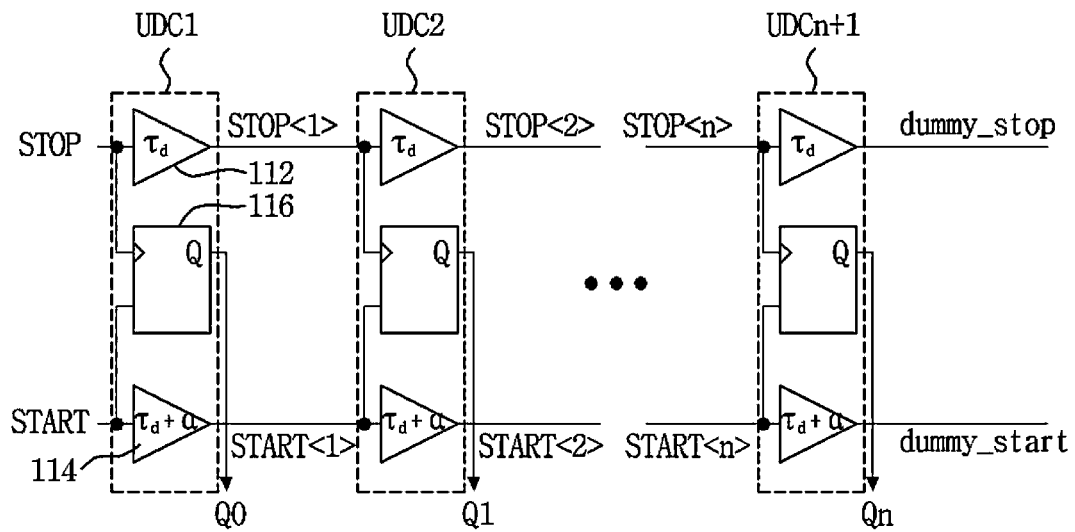
FIG. 7 is a detailed block diagram illustrating an embodiment of a time digital converter.

Each of the time digital converters 110 and 120 may output the first delay value QA<1:n> or the second delay value QB<1:n> by being configured as shown in FIG. 7. For the sake of convenience in explanation, the configuration of the time digital converter 110 will be described, and the configuration of the time digital converter 120 may be understood by referring to the configuration of the time digital converter 110.

The time digital converter 110 receives the clock CK0 as a start clock START and receives the clock CK1 as a stop clock STOP. The time digital converter 110 includes a chain of unit delay cells UDC1 to UDCn+1 which shift the start clock START and the stop clock STOP in a stepwise manner.

Each of the unit delay cells UDC1 to UDCn+1 shifts the start clock START by further delaying the start clock START by a preset unit delay difference time than the stop clock STOP, and outputs a first difference value by determining the phase of the received start clock START on the basis of the received stop clock STOP.

To this end, each of the unit delay cells UDC1 to UDCn+1 is configured to include buffers 112 and 114 and a phase determiner 116.

Referring to the unit delay cell UDC1, the buffer 112 is configured to output a stop clock STOP<1> shifted by delaying the stop clock STOP by a first unit delay time $\tau_d$, and the buffer 114 is configured to output a start clock START<1> shifted by delaying the start clock START by a second unit delay time obtained by summing the first unit delay time $\tau_d$ and a unit delay difference time $\alpha$.

The phase determiner 116 is configured to output a first difference value Q0 by determining the phase of the start clock START on the basis of the stop clock STOP. The phase determiner 116 may be configured by a flip-flop, and may output the first difference value Q0 of the same level as the level of the start clock START at a time point when the stop clock STOP is enabled. The first difference value Q0 may be outputted at a high or low level, and may form one bit of the first delay value QA<1:n>.

Since the configurations and operations of the other unit delay cells UDC2 to UDCn+1 may be understood by referring to the configuration and operation of the unit delay cell UDC1, detailed description therefor will be omitted.

The time digital converter 120 includes a chain of unit delay cells which receive the clock CK1 as a start clock, receive the clock CK2 as a stop clock and shift the start clock and the stop clock in a stepwise manner.

Since the configuration and operation of the time digital converter 120 and the configurations and operations of the unit delay cells included in the time digital converter 120 may be understood by referring to the configuration and operation of the time digital converter 110, detailed description therefor will be omitted.

By the above configuration, the time digital converter 110 may output first difference values Q0 to Qn as the first delay value QA<1:n>, and the time digital converter 120 may output second difference values as the second delay value QB<1:n>. For example, the first delay value QA<1:n> may be understood as data including first difference values of n bits, and the second delay value QB<1:n> may be understood as data including second difference values of n bits.

The input-side and output-side clocks CK0 and CK1 of the delay unit UD1 correspond to the start clock START1 and the stop clock STOP1 which are inputted to the time digital converter 110, and the input-side and output-side clocks CK1 and CK2 of the delay unit UD2 correspond to the start clock START2 and the stop clock STOP2 which are inputted to the time digital converter 120.

Figure 8:
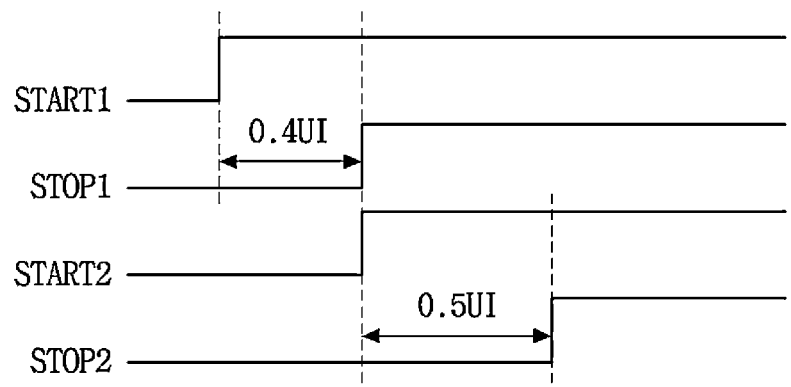
FIG. 8 is a timing diagram illustrating inputs of the time digital converter.

Therefore, the input timing diagram of the time digital converters 110 and 120 may be exemplified as in FIG. 8.

In FIG. 8, the first delay time of the delay unit UD1 is exemplified as 0.4 UI, and the second delay time of the delay unit UD2 is exemplified as 0.5 UI. Namely, it may be understood that the delay unit UD1 has a shorter delay time than the delay unit UD2 due to a difference in input-side capacitance. It may be determined that this case corresponds to FIG. 3.

The time digital converter 110 may output the first delay value QA<1:n> corresponding to the first delay time 0.4 UI of FIG. 8, and the time digital converter 120 may output the second delay value QB<1:n> corresponding to the second delay time 0.5 UI of FIG. 8.

Figure 9:
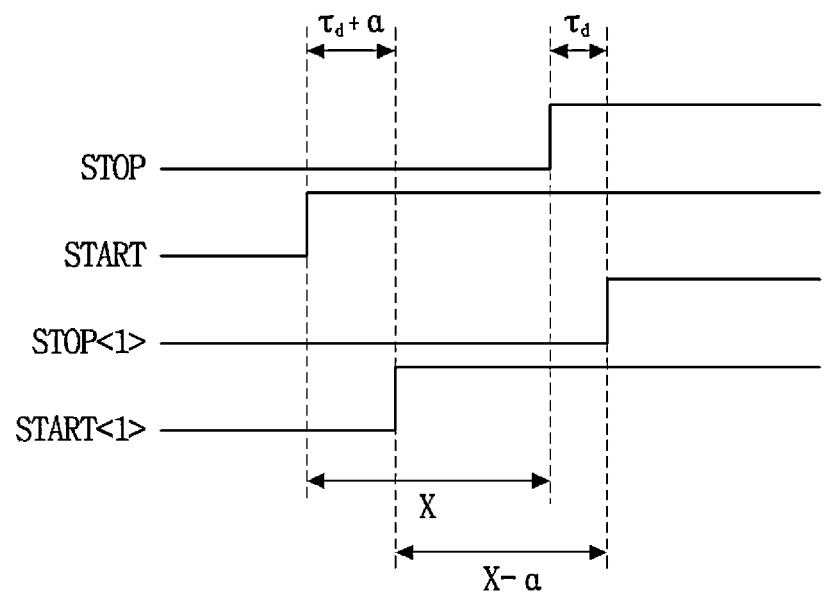
FIG. 9 is a timing diagram for explaining the resolution calculation of the time digital converter.

In order to output the difference values Q0 to Qn constituting the first delay value QA<1:n> and the second delay value QB<1:n>, a timing diagram for calculating the resolution of the unit delay cells UDC1 to UDCn+1 may be exemplified as in FIG. 9.

The resolution of the unit delay cells UDC1 to UDCn+1 may be set as a signal relationship between two adjacent unit delay cells. In the embodiment of the present disclosure, the resolution of the unit delay cells UDC1 to UDCn+1 may be set as the unit delay difference time α.

For example, the calculation of the resolution may be explained by comparing the inputs of the unit delay cell UDC1 and the unit delay cell UDC2 with reference to FIG. 9.

A time point at which the stop pulse STOP is received in the unit delay cell UDC1 and a time point at which the stop pulse STOP<1> is received in the unit delay cell UDC2 have a difference corresponding to a delay time of the buffer 112, that is, the first unit delay time Td.

A time point at which the start pulse START is received in the unit delay cell UDC1 and a time point at which the start pulse START<1> is received in the unit delay cell UDC2 have a difference corresponding to a delay time of the buffer 114, that is, a second unit delay time $\tau_d$+a obtained by summing the first unit delay time $\tau_a$ and the unit delay difference time α.

Therefore, when it is defined that the stop pulse STOP and the start pulse START received in the unit delay cell UDC1 are received to have a time difference X, the stop pulse STOP<1> and the start pulse START<1> received in the unit delay cell UDC2 may be received to have a time difference X-a.

That is to say, the time difference X between the stop pulse STOP and the start pulse START gradually decreases by the unit delay difference time α set as the resolution as unit delay cells are passed through, and the unit delay cells UDC1 to UDCn+1 of the time digital converter 110 may output the difference values Q0 to Qn by determining the start pulse START, which varies by the unit delay difference time α, on the basis of the stop pulse STOP. As a result, the time digital converter 110 may output the difference values Q0 to Qn obtained by determining the first delay time of the clock CK0 and the clock CK1, as the first delay value QA<1:n>.

By the same configuration and operation as those of the time digital converter 110 described above, the time digital converter 120 may output difference values obtained by determining the second delay time between the stop pulse STOP corresponding to the clock CK2 and the start pulse START corresponding to the clock CK1, as the second delay value QB<1:n>.

For example, each of the unit delay cells UDC1 to UDCn+1 outputs a difference value of a high level if the start pulse START is a high level when the stop pulse STOP transitions to a high level. The time difference X between the stop pulse STOP and the start pulse START gradually decreases by the unit delay difference time α set as the resolution as unit delay cells are passed through.

Therefore, each of unit delay cells corresponding to a time point at which the first delay time has elapsed in the time digital converter 110 outputs a difference value of a low level. In other words, the time digital converter 110 may output the first delay value QA<1:n> to include difference values of successive high levels whose number corresponds to the first delay time.

Similarly, each of unit delay cells corresponding to a time point at which the second delay time has elapsed in the time digital converter 120 outputs a difference value of a low level. In other words, the time digital converter 120 may output the second delay value QB<1:n> to include difference values of successive high levels whose number corresponds to the second delay time.

Namely, the numbers of difference values of high levels included in the first delay value QA<1:n> and the second delay value QB<1:n> are different from each other in correspondence to a difference in delay time between the first delay time and the second delay time.

The comparator 130 is configured to output the comparison value SW<1:n> as a result of comparing whether the difference values included in the first delay value QA<1:n> of the time digital converter 110 and the difference values included in the second delay value QB<1:n> of the time digital converter 120 are respectively the same.

Figure 10:
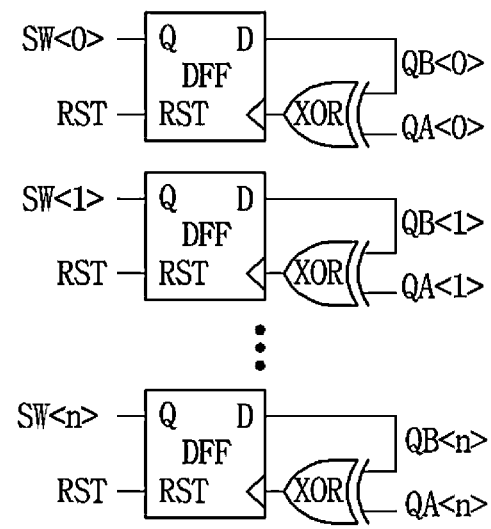
FIG. 10 is a detailed block diagram illustrating an embodiment of a comparator.

To this end, the comparator 130 may be configured as shown in FIG. 10.

The comparator 130 is configured to output unit comparison values obtained by comparing whether difference values of respective unit delay cells of the time digital converters 110 and 120 corresponding to the same orders are the same, as a comparison value. That is to say, it may be understood that, by determining whether difference values are the same, the comparator 130 outputs the comparison value SW<1:n> corresponding to a difference in the number of difference values of high levels between the first delay value QA<1:n> and the second delay value QB<1:n>.

To this end, the comparator 130 may include exclusive OR gates XOR which compare difference values of unit delay cells of the same orders, and D flip-flops DFF which output the difference values of the time digital converter 120 as unit comparison values in synchronization with the outputs of the exclusive OR gates XOR.

In more detail, the comparator 130 includes an exclusive OR gate XOR for comparing difference values QA<0> and QB<0> of the unit delay cells UDC1 of the time digital converters 110 and 120 and a D flip-flop DFF. The exclusive OR gate XOR is configured to output different logic values when the difference values QA<0> and QB<0> of the unit delay cells UDC1 of the time digital converters 110 and 120 are the same as each other and when the difference values QA<0> and QB<0> of the unit delay cells UDC1 of the time digital converters 110 and 120 are different from each other. The D flip-flop DFF is configured to output the difference value QB<0> of the unit delay cell UDC1 of the time digital converter 120 by using the output of the exclusive OR gate XOR as a clock.

Further, the comparator 130 includes exclusive OR gates XOR and D flip-flops DFF corresponding to the difference values QA<1> to QA<n> and QB<1> to QB<n>, respectively, of the remaining unit delay cells UDC2 to UDCn+1 of the time digital converters 110 and 120. The operations of the exclusive OR gates XOR and the D flip-flops DFF may be understood by referring to the operation for comparing the difference values QA<0> and QB<0> of the unit delay cells UDC1.

In other words, it may be understood that the comparator 130 compares the first delay value QA<1:n> and the second delay value QB<1:n> to output the comparison value SW<1:n> corresponding to a difference in the number of difference values of high levels.

The comparison value SW<1:n> of the comparator 130 according to the above configuration may be provided to the capacitor bank 140, and the capacitor bank 140 may provide controlled capacitance to the input side of the first delay unit UD1 in response to the comparison value SW<1:n>.

Figure 11:
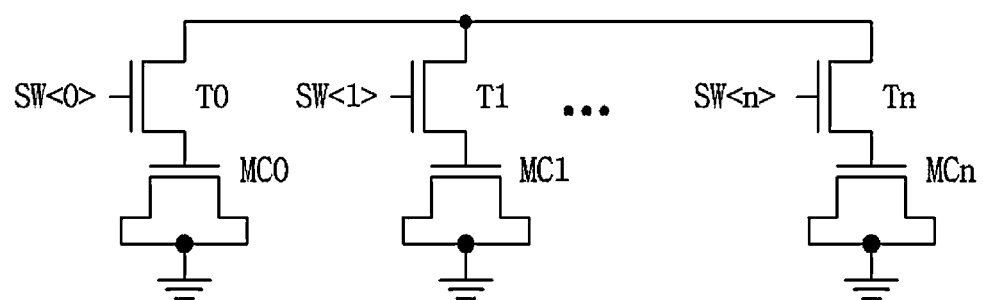
FIG. 11 is a detailed circuit diagram illustrating an embodiment of a capacitor bank.

To this end, the capacitor bank 140 may be configured to include unit capacitors MC0 to MCn which are configured in parallel at the input side of the first delay unit UD1 and switches T0 to Tn which selectively connect the unit capacitors MC0 to MCn to the input side of the first delay unit UD1 by the comparison value SW<1:n> as shown in FIG. 11. The unit capacitors MC0 to MCn may be configured using MOS capacitors. The switches T0 to Tn may be configured using NMOS transistors, and each NMOS transistor may be configured to receive a comparison value through a gate thereof.

Namely, the capacitor bank 140 may provide capacitance to the input side of the first delay unit UD1 by unit capacitors which are connected to switches turned on by the comparison value SW<1:n>.

As a result, when the first delay unit UD1 has a longer delay time than the remaining delay units, the capacitor bank 140 may compensate for a difference in delay time by providing low capacitance, and when the first delay unit UD1 has a shorter delay time than the remaining delay units, the capacitor bank 140 may compensate for a difference in delay time by providing high capacitance.

As is apparent from the above description, according to the embodiments of the present disclosure, it is possible to compensate for a difference in delay time occurring in a multi-stage delay chain configured in a clock recovery circuit of a data reception device.

Therefore, according to the embodiments of the present disclosure, advantages are provided in that a clock and data may be easily recovered and scalability to changes in process may be ensured.

Also, according to the embodiments of the present disclosure, a margin for the setup or hold of data, required when data is recovered using a recovered clock, may be stably secured, and as a result, advantages are provided in that data may be easily recovered in a high-speed operation.

What is claimed is:

1. A clock recovery circuit for a display, comprising:
    a clock detector configured to detect a first clock in a clock data signal;
    a voltage control delay circuit including delay units which form a multi-stage delay chain, and configured to generate delayed clocks by delaying the first clock through the delay units; and
    a delay compensator configured to control capacitance of an input side of a first delay unit to compensate for a difference in delay time between a first delay time of the first delay unit and a second delay time of a second delay unit selected among remaining delay units.

2. The clock recovery circuit of claim 1, further comprising:
    a delay controller configured to output a voltage control signal corresponding to a phase difference between a reference clock and a feedback clock,
    wherein the reference clock uses a first delayed clock which is outputted from the first delay unit of a preset position of the multi-stage delay chain,
    wherein the feedback clock uses a second delayed clock which is outputted from a last delay unit of the multi-stage delay chain, and
    wherein the voltage control delay circuit controls delay times of the delay units according to a level of the voltage control signal.

3. The clock recovery circuit of claim 2, wherein the delay controller comprises:
    a phase detector configured to output an up control signal and a down control signal corresponding to a phase difference between the reference clock and the feedback clock;
    a charge pump configured to provide an output voltage according to performing a pull-up in response to the up control signal or a pull-down in response to the down control signal; and
    a loop filter configured to output the voltage control signal of a level corresponding to the output voltage.

4. The clock recovery circuit of claim 1, wherein
    the delay compensator includes a capacitor bank which is coupled to the input side of the first delay unit, and
    the delay compensator controls the capacitance of the capacitor bank in correspondence to the difference in delay time such that the first delay time and the second delay time become the same as each other.

5. The clock recovery circuit of claim 4, wherein the delay compensator decreases the capacitance in correspondence to the difference in delay time by which the first delay time is longer than the second delay time, and increases the capacitance in correspondence to the difference in delay time by which the first delay time is shorter than the second delay time.

6. The clock recovery circuit of claim 1, wherein the delay compensator comprises:
a first time digital converter configured to compare the first clock of the input side of the first delay unit and a second clock of an output side of the first delay unit to output a first delay value corresponding to the first delay time;
a second time digital converter configured to compare a third clock of an input side of the second delay unit and a fourth clock of an output side of the second delay unit to output a second delay value corresponding to the second delay time;
a comparator configured to compare the first delay value and the second delay value to output a comparison value corresponding to the difference in delay time; and
a capacitor bank coupled to the input side of the first delay unit, and configured to provide the controlled capacitance in response to the comparison value.

7. The clock recovery circuit of claim 6, wherein
the first delay unit is located at the first of delay units which forming the multi-stage delay chain,
the second delay unit is located at the second of delay units which forming the multi-stage delay chain, and
the second clock is the same as the third clock.

8. The clock recovery circuit of claim 6, wherein
the first time digital converter includes a first chain of first unit delay cells which receives the first clock as a first start clock, receives the second clock as a first stop clock and shifts the first start clock and the first stop clock in a stepwise manner,
the second time digital converter includes a second chain of second unit delay cells which receives the third clock as a second start clock, receives the fourth clock as a second stop clock and shifts the second start clock and the second stop clock in a stepwise manner,
each first unit delay cell shifts the first start clock by more delaying the first start clock by a preset unit delay difference time than the first stop clock, and outputs a first difference value by determining a phase of the received first start cock on the basis of the received first stop clock,
each second unit delay cell shifts the second start clock by more delaying the second start clock by the unit delay difference time than the second stop clock, and outputs a second difference value by determining a phase of the received second start cock on the basis of the received second stop clock,
the first time digital converter outputs first difference values as the first delay value, and
the second time digital converter outputs second difference values as the second delay value.

9. The clock recovery circuit of claim 8,
wherein the first unit delay cell comprises:
a first buffer configured to shift the first stop clock by delaying the first stop clock by a first unit delay time;
a second buffer configured to shift the first start clock by delaying the first start clock by a second unit delay time obtained by summing the first unit delay time and the unit delay difference time; and
a first phase determiner configured to output the first difference value by determining a phase of the first start clock on the basis of the first stop clock, and wherein the second unit delay cell comprises:
a third buffer configured to shift the second stop clock by delaying the second stop clock by the first unit delay time;
a fourth buffer configured to shift the second start clock by delaying the second start clock by the second unit delay time; and
a second phase determiner configured to output the second difference value by determining a phase of the second start clock on the basis of the second stop clock.

10. The clock recovery circuit of claim 8, wherein the comparator generates unit comparison values by comparing whether the first difference values and the second difference values are respectively the same, and outputs the unit comparison values as the comparison value.

11. The clock recovery circuit of claim 6, wherein the capacitor bank includes a plurality of unit capacitors which are configured in parallel and are able to be selected by the comparison value.

12. A clock recovery circuit for a display, comprising:
a clock recoverer configured to generate delayed clocks by passing a first clock, detected in a clock data signal, through delay units which form a multi-stage delay chain; and
a delay compensator configured to control a first delay time of a first delay unit to be the same as a second delay time of remaining delay units,
wherein the delay compensator provides controlled capacitance to an input side of the first delay unit to compensate for a difference in delay time between the first delay time and the second delay time.

13. The clock recovery circuit of claim 12, wherein
the delay compensator includes a capacitor bank which is coupled to the input side of the first delay unit, and
the delay compensator controls the capacitance of the capacitor bank in correspondence to the difference in delay time such that the first delay time and the second delay time become the same as each other.

14. The clock recovery circuit of claim 12, wherein the delay compensator comprises:
a first time digital converter configured to compare the first clock of the input side of the first delay unit and a second clock of an output side of the first delay unit to output a first delay value corresponding to the first delay time;
a second time digital converter configured to compare a third clock of an input side of a second delay unit and a fourth clock of an output side of the second delay unit to output a second delay value corresponding to the second delay time;
a comparator configured to compare the first delay value and the second delay value to output a comparison value corresponding to the difference in delay time; and
a capacitor bank coupled to the input side of the first delay unit, and configured to provide the controlled capacitance in response to the comparison value.

15. The clock recovery circuit of claim 14, wherein
the first delay unit is located at the first of delay units which forming the multi-stage delay chain,
the second delay unit is located at the second of delay units which forming the multi-stage delay chain, and
the second clock is the same as the third clock.

16. The clock recovery circuit of claim 14, wherein
the first time digital converter includes a first chain of first unit delay cells which receives the first clock as a first start clock, receives the second clock as a first stop clock and shifts the first start clock and the first stop clock in a stepwise manner, the second time digital converter includes a second chain of second unit delay cells which receives the third clock as a second start clock, receives the fourth clock as a second stop clock and shifts the second start clock and the second stop clock in a stepwise manner, each first unit delay cell shifts the first start clock by more delaying the first start clock by a preset unit delay difference time than the first stop clock, and outputs a first difference value by determining a phase of the received first start cock on the basis of the received first stop clock, each second unit delay cell shifts the second start clock by more delaying the second start clock by the unit delay difference time than the second stop clock, and outputs a second difference value by determining a phase of the received second start cock on the basis of the received second stop clock, the first time digital converter outputs first difference values as the first delay value, and the second time digital converter outputs second difference values as the second delay value.

17. The clock recovery circuit of claim 16, wherein the first unit delay cell comprises:
a first buffer configured to shift the first stop clock by delaying the first stop clock by a first unit delay time;
a second buffer configured to shift the first start clock by delaying the first start clock by a second unit delay time obtained by summing the first unit delay time and the unit delay difference time; and
a first phase determiner configured to output the first difference value by determining a phase of the first start clock on the basis of the first stop clock, and
wherein the second unit delay cell comprises:
a third buffer configured to shift the second stop clock by delaying the second stop clock by the first unit delay time;
a fourth buffer configured to shift the second start clock by delaying the second start clock by the second unit delay time; and
a second phase determiner configured to output the second difference value by determining a phase of the second start clock on the basis of the second stop clock.

* * * * *